US008875979B2

(12) United States Patent
Yung et al.

(10) Patent No.: US 8,875,979 B2
(45) Date of Patent: Nov. 4, 2014

(54) APPARATUS AND METHOD FOR DETERMINING AN ALIGNMENT OF A BONDHEAD OF A DIE BONDER RELATIVE TO A WORKCHUCK

(75) Inventors: Chung Sheung Yung, Hong Kong (CN); Chi Ming Chong, Hong Kong (CN); Gary Peter Widdowson, Hong Kong (CN)

(73) Assignee: ASM Technology Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/463,970

(22) Filed: May 4, 2012

(65) Prior Publication Data

US 2013/0292454 A1 Nov. 7, 2013

(51) Int. Cl.
*B23K 20/00* (2006.01)
*B23K 20/02* (2006.01)
*B23K 31/12* (2006.01)
*B23K 31/02* (2006.01)

(52) U.S. Cl.
USPC ........... 228/102; 228/227; 228/228; 228/230; 228/101; 228/103

(58) Field of Classification Search
USPC .................. 228/227, 228, 230, 101, 102, 103
See application file for complete search history.

(56) References Cited

U.S. PATENT DOCUMENTS

| 4,311,959 A * | 1/1982 | Riessland et al. ............. 324/662 |
| 5,324,381 A * | 6/1994 | Nishiguchi ................... 156/297 |
| 5,467,675 A * | 11/1995 | Dow et al. ....................... 82/1.11 |
| 2004/0187593 A1* | 9/2004 | Okada ............................ 73/780 |
| 2007/0164762 A1* | 7/2007 | Nayak et al. .................. 324/758 |

* cited by examiner

*Primary Examiner* — Erin Saad
(74) *Attorney, Agent, or Firm* — Sughrue Mion, PLLC

(57) ABSTRACT

Disclosed is an apparatus for determining an alignment of a bondhead of a die bonder relative to a workchuck. Specifically, the apparatus comprises: i) a sensor configured to measure a distance between the bondhead and the sensor; and ii) a positioning device coupled to the sensor, the positioning device being configured to position the sensor relative to a plurality of locations on the bondhead facing the sensor. In particular, the sensor is operative to measure a set of distances between each of the plurality of locations on the bondhead and the sensor, the set of distances being for determining the alignment of the bondhead. A method of determining an alignment of a bondhead of a die bonder relative to a workchuck is also disclosed.

10 Claims, 3 Drawing Sheets

APPARATUS AND METHOD FOR DETERMINING AN ALIGNMENT OF A BONDHEAD OF A DIE BONDER RELATIVE TO A WORKCHUCK

FIELD OF THE INVENTION

This invention relates to an apparatus and method for determining an alignment of a bondhead of a die bonder relative to a workchuck. The apparatus is particularly, but not exclusively, applicable as a measuring device to determine an alignment of the bondhead of the die bonder with respect to the workchuck before semiconductor dies are bonded to a semiconductor die carrier that is supported by the workchuck.

BACKGROUND OF THE INVENTION

A die bonder is an apparatus that picks a semiconductor die from a supply of semiconductor dies (e.g. a wafer tray) and places it on a semiconductor die carrier (e.g. a leadframe). Such a process is known as die bonding. The die bonder comprises two important modules: i) a bondhead for transferring and bonding the semiconductor die to the semiconductor die carrier and ii) a workchuck for supporting the semiconductor die carrier during the die bonding process. To ensure the quality and reliability of the die bonding process, the bondhead and the workchuck should be mutually aligned. Accordingly, the surfaces of the bondhead and the workchuck facing each other should be parallel to each other before the semiconductor die carrier is placed on the workchuck for die bonding. During die bonding, a bonding surface of the semiconductor die is pressed by the bondhead against the semiconductor die carrier with a designated force and under a certain temperature profile. Since the bonding surface of the semiconductor die includes many solder or gold bumps with dimensions not exceeding a few hundred microns, a small deviation of the alignment of the bondhead with respect to the workchuck (e.g. 10 microns) might result in side forces and placement error, which thereby compromises the quality and reliability of the die bonding process. Importantly thus, the alignment of the bondhead with respect to the workchuck should be maintained to ensure the quality and reliability of the die bonder.

A conventional method of determining the parallelism of the surfaces of the bondhead and the workchuck facing each other involves the use of carbon paper. The carbon paper is a thin piece of pressure sensitive paper that changes colour when pressure is applied. To determine the alignment of the bondhead with respect to the workchuck, the carbon paper is placed on the workchuck right below the bondhead. The bondhead is then moved downwards to press the carbon paper against the workchuck. Thereafter, the bondhead is moved upwards for an operator to inspect a colour pattern on the carbon paper to determine the parallelism of the surfaces of the bondhead and the workchuck facing each other, and hence, the alignment of the bondhead relative to the workchuck.

Such a method of determining the alignment of the bondhead, however, is inaccurate since the carbon paper is unable to feedback the degree of the bondhead alignment to the die bonder. Accordingly, the operator has to manually determine the magnitude of a tilt angle of the bondhead relative to the workchuck in order to adjust the bondhead position. The human intervention required in this conventional method of determining the bondhead alignment means that the desired accuracy would be difficult to achieve.

Other conventional methods may include the use of optical sensors such as autocollimators or lasers to determine the parallelism of the bondhead and workchuck at room temperature. However, these methods are not able to determine the parallelism at high temperatures (200~400° C.) due to disturbance of air density.

Thus, it is an object of the present invention to seek to provide an apparatus and method for determining an alignment of a bondhead of a die bonder relative to a workchuck that provides higher measurement accuracy than the conventional method described above and/or minimizes the degree of human intervention. Preferably, the apparatus and method for determining the bondhead alignment can operate at high temperatures (200~400° C.).

SUMMARY OF THE INVENTION

A first aspect of the present invention is an apparatus for determining an alignment of a bondhead of a die bonder relative to a workchuck. Specifically, the apparatus comprises: i) a sensor configured to measure a distance between the bondhead and the sensor; and ii) a positioning device coupled to the sensor, the positioning device being configured to position the sensor relative to a plurality of locations on the bondhead facing the sensor. In particular, the sensor is operative to measure a set of distances between each of the plurality of locations on the bondhead and the sensor, the set of distances being for determining the alignment of the bondhead.

A second aspect of the present invention is an apparatus for determining an alignment of a bondhead of a die bonder relative to a workchuck. Specifically, the apparatus comprises: i) first and second sensors configured to measure distances; ii) a positioning device coupled to the first and second sensors, the positioning device being configured to position the first sensor relative to a first plurality of locations on the bondhead facing the first sensor, and to position the second sensor relative to a second plurality of locations on the workchuck facing the second sensor. In particular, the first sensor is operative to measure a first set of distances between each of the first plurality of locations on the bondhead and the first sensor, and the second sensor is operative to measure a second set of distances between each of the second plurality of locations on the workchuck and the second sensor, the first and second sets of distances being for determining the alignment of the bondhead.

Some optional features of the apparatus have been defined in the dependent claims.

For instance, the apparatus according to the second aspect may further comprise a processor configured to add each of the distances from the first set of distances with a corresponding distance from the second set of distances to generate a plurality of added distances, and to compare the plurality of added distances for determining the alignment of the bondhead.

Furthermore, the or each sensor of the apparatus may be a non-contact sensor. For instance, the non-contact sensor may be a capacitive sensor. Since an electrical field that is applied to the capacitive sensor is not affected by high temperatures (e.g. 200~400° C.), the apparatus may advantageously operate at such high temperatures determine the parallelism between the bondhead and the workchuck.

Moreover, the apparatus may further comprise a sensor mount for coupling the or each sensor to the positioning device. Preferably, the sensor mount comprises a thermal control device for controlling a temperature of the or each sensor. For instance, the thermal control device may comprise an interior channel for allowing a cooling fluid to cool the sensor mount. Preferably also, the sensor mount is made of a low thermal expansion material. An example of the low thermal expansion material may be a material selected from the group of materials consisting of: i) Invar (comprising FeNi36); ii) Superinvar (comprising Ni-Fe alloy); and iii) a Lithium Aluminosilicate glass-ceramic such as Zerodur®.

A third aspect of the invention is a method of determining an alignment of a bondhead of a die bonder relative to a workchuck. Specifically, the method comprises the steps of: a positioning device positioning a sensor relative to a plurality of locations on the bondhead facing the sensor, the sensor being configured to measure a distance between the bondhead and the sensor; and the sensor measuring a first set of distances between each of the plurality of locations on the bondhead and the sensor, to determine the alignment of the bondhead.

A fourth aspect of the invention is a method of determining an alignment of a bondhead of a die bonder relative to a workchuck. Specifically, the method comprises the steps of: a positioning device positioning a first sensor relative to a first plurality of locations on the bondhead facing the first sensor, and positioning a second sensor relative to a second plurality of locations on the workchuck facing the second sensor, the first and second sensors being configured to measure distances; and the first sensor measuring a first set of distances between each of the first plurality of locations on the bondhead and the first sensor, and the second sensor measuring a second set of distances between each of the second plurality of locations on the workchuck and the second sensor, to determine the alignment of the bondhead.

Some optional steps of the method have also been defined in the dependent claims.

BRIEF DESCRIPTION OF THE DRAWINGS

Preferred embodiments of the invention will now be described, by way of example only, with reference to the accompanying drawings, of which.

DETAILED DESCRIPTION OF THE PREFERRED EMBODIMENTS

Figure 1:
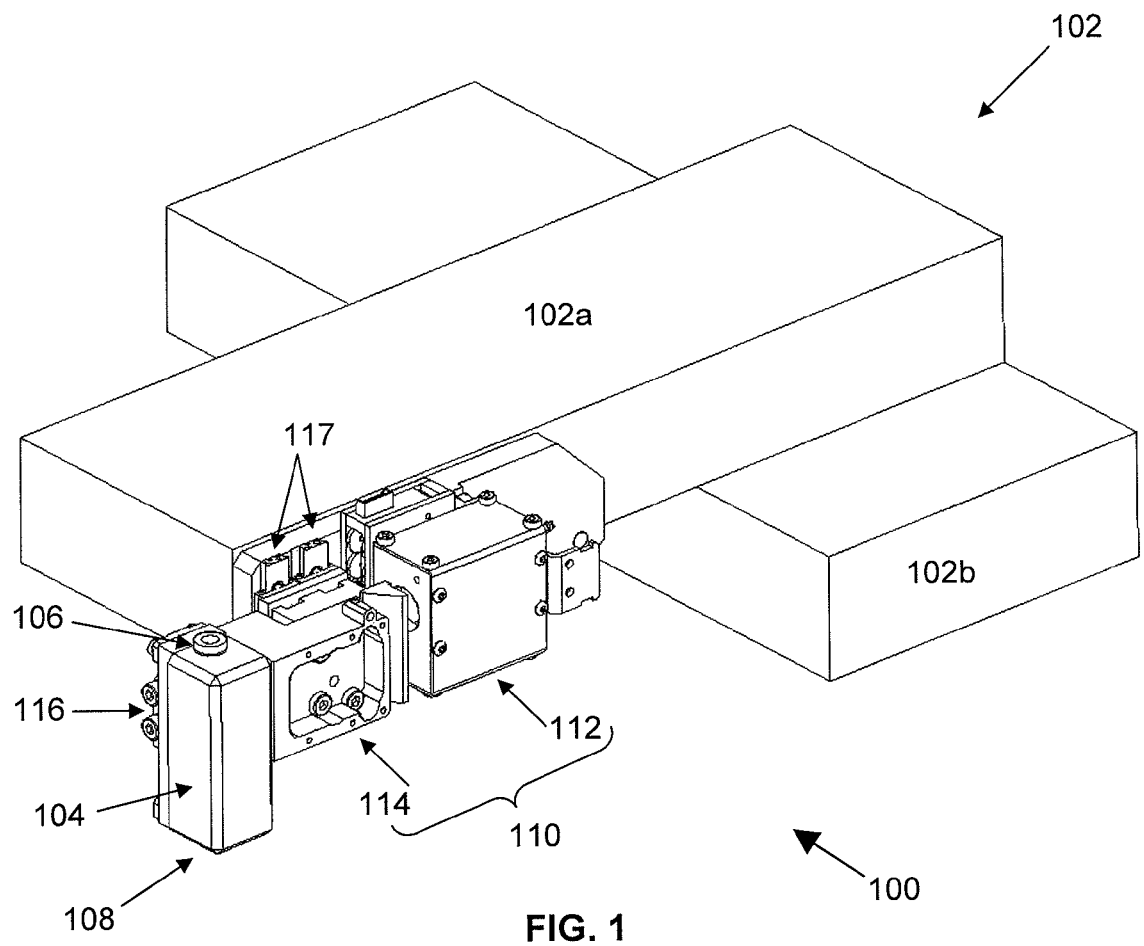
FIG. 1 shows the preferred embodiment of the present invention for determining alignment of a bondhead of a die bonder relative to a workchuck.
Figure 1:
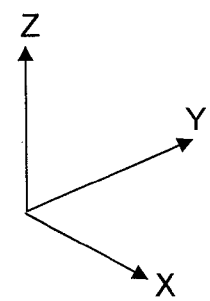

FIG. 1 shows a bondhead alignment device 100 for determining an alignment of a bondhead of die bonder relative to a workchuck that supports a semiconductor die carrier such as a leadframe. In particular, the bondhead alignment device 100 comprises: i) a positioning device (shown as an XY table 102); ii) a sensor mount 104; iii) a plurality of distance-measuring sensors (shown as capacitive sensors 106, 108) mounted to the top and bottom of the sensor mount 104 respectively; and iv) a motor mount assembly 110 coupled between the XY table 102 and the sensor mount 104.

The XY table 102 comprises two perpendicularly-arranged robotic arms 102a, 102b. Specifically, the robotic arm 102a is mounted on the robotic arm 102b, and is movable relative to the robotic arm 102b linearly along an X-direction. The robotic arm 102b, on the other hand, is mounted on linear guides (not shown) and moves linearly along the linear guides along a Y-direction perpendicular to the X-direction. Since the robotic arm 102a is mounted on top of the robotic arm 102b, the robotic arm 102a moves together with the robotic arm 102b as the latter moves along the Y-direction. Moreover, as the sensor mount 104 is coupled to the XY table 102 via the motor mount assembly 110, the sensor mount 104 can be moved to any point on an XY plane.

The motor mount assembly 110 includes a motor mount 112 and a position actuator 114, both of which are mounted to the XY table 102 and thus move on the XY plane. In particular, the motor mount 112 houses a motor (not shown) for moving the motor mount assembly 110 linearly along the robotic arm 102a in the Y direction. As for the position actuator 114, it is connected between the sensor mount 104 and the motor mount 112, and is actuable to move the sensor mount 104 in relation to the XY plane. The position actuator 114 is also movable along vertical guides 117 along a Z-axis, which is perpendicular to both the X and Y axes.

The sensor mount 104—which is connected to the position actuator 114 of the motormount assembly 110—comprises top and bottom ends configured to receive the capacitive sensors 106, 108. Since the bondhead alignment device 100 may be subject to temperature variation in a high temperature environment (e.g. more than 200° C.), the sensor mount 104 is preferably made of low Coefficient of Thermal Expansion ('CTE') material, such as Invar (comprising FeNi36), Superinvar (comprising Ni-Fe alloy), and/or a Lithium Aluminosilicate glass-ceramic such as Zerodur®. Since Zerodur® has a lower CTE than Invar and Superinvar, the sensor mount 104 is preferably made of Zerodur® with its length limited to at most 60 mm. If Invar or Superinvar were used to make the sensor mount 104, the length of the sensor mount 104 should preferably be shorter than 60 mm.

The sensor mount 104 further houses a thermal control unit 116 comprises a heater and a cooling device for thermal control of the sensor mount 104. In particular, the thermal control unit 116 comprises an interior channel for allowing cooling air to flow along the sensor mount 104. The thermal control unit 116 is useful for cooling the sensor mount 104, particularly if the bondhead alignment device 100 is used in a high temperature environment for more than tenth seconds. By having such a thermal control unit 116, the sensor mount 104 can tolerate a temperature change of up to 4° C. and achieving a measurement resolution of up to 50 nm irrespective of the position change due to thermal deformation of the position actuator 114 and the motor mount assembly 110 at high temperatures (e.g. 200~400° C.).

It should be, of course, be appreciated that other cooling fluids such as cooling water may be used in place of the cooling air, as long as it achieves the intended purpose of cooling the sensor mount 104 especially if the bondhead alignment device 100 were used in a high temperature environment.

The capacitive sensors 106, 108, which are respectively connected to the top and bottom ends of the sensor mount 104, belong to a class of non-contact displacement sensors. Non-contact capacitive sensors work by measuring changes in an electrical property called capacitance. Capacitance describes how two electrical conductors with a dielectric material between them respond to a voltage difference applied to them. When a voltage is applied to the electrical conductors, an electrical field is created between them causing positive and negative electrical charges to collect on each electrical conductor. If polarity of the voltage is reversed, the electrical charges will also reverse. Specifically, an alternating voltage is used to cause the electrical charges to continually reverse their positions. The moving of the electrical charges creates an alternating current, which is detected by the non-contact capacitive sensors. The amount of current flow is determined by the capacitance, and the capacitance is determined by the area and distance between the electrical conductors by the relationship, as follows:

$$C = \varepsilon_r \varepsilon_0 \frac{A}{d}$$

where C is the capacitance, A is the area of overlap of the two electrical conductors, $\varepsilon_r$ is the relative dielectric constant, $\varepsilon_0$ is the dielectric constant of free space, and d is the separation between the electrical conductors.

Accordingly, the capacitance C is directly proportional to the area of overlap A of the electrical conductors and the dielectric constant $\varepsilon_r \varepsilon_0$ of the dielectric material between them, and inversely proportional to the separation d between them—this means that electrical conductors that are larger and closer will induce a larger alternating current than electrical conductors that are smaller and more distant to each other.

Preferably, the capacitive sensors 106, 108 are also made of low CTE material, such as Invar (comprising FeNi36), Super-invar (comprising Ni-Fe alloy, and/or a Lithium Aluminosilicate glass-ceramic such as Zerodur®, to ensure stability and measurement accuracy at high temperature. This is because the bondhead alignment device 100 may operate in a high temperature environment (e.g. more than 200° C.), and it would thus be necessary to minimize the effect of thermal expansion of the capacitive sensors 106, 108 to ensure accuracy.

To determine the alignment of the bondhead of the die bonder relative to the workchuck, each of the capacitive sensors 106, 108 functions as one of the electrical conductors while its target object functions as another electrical conductor. Since the sizes of the capacitive sensors 106, 108 and their target objects are constant, as is the dielectric material between them, the capacitive sensors 106, 108 are thus able to measure distances from their target objects. By mounting the capacitive sensors 106, 108 to the top and bottom of the sensor mount 104 respectively, such a configuration allows the bondhead alignment device 100 to measure a distance between an upper conductive target and the top capacitive sensor 106, and a distance between the bottom capacitive sensor 108 and a lower conductive target.

FIGS. 2a-2d show an operation of the bondhead alignment device 100 to determine the alignment of a bondhead 200 relative to a workchuck 202. In particular, an alternating electrical source is connected between the bondhead alignment device and each of the bondhead 200 and the workchuck 202 for the capacitive sensors 106, 108 to measure distance when operated.

The capacitive sensors 106, 108 are first positioned by the XY positioning table and the motor mount assembly 110 between the die bonder's bondhead 200 and the workchuck 202. Thus, a bonding surface at a base of the bondhead 200 that picks and places the semiconductor die forms the upper conductive target, while a supporting surface at a top of the workchuck 202 that supports the leadframe forms the lower conductive target. As the capacitive sensors 106, 108 require the upper and lower conductive targets to be electrical conductors, the bonding surface of the bondhead 200 and the supporting surface of the workchuck 202 should be made of an electrical conducting material.

After the capacitive sensors 106, 108 have been positioned between the bondhead 200 and the workchuck 202, the bondhead alignment device 100 measures two distances at each of 4 separate vertical datum axes A-A', B-B', C-C', and D-D' arranged in relation to the bondhead 200 and the workchuck 202 along the vertical Z-axis—that is, i) an upper distance between the bonding surface of the bondhead 200 and the top capacitive sensor 106; and ii) a lower distance between the bottom capacitive sensor 108 and the supporting surface of the workchuck 202.

Figure 2A:
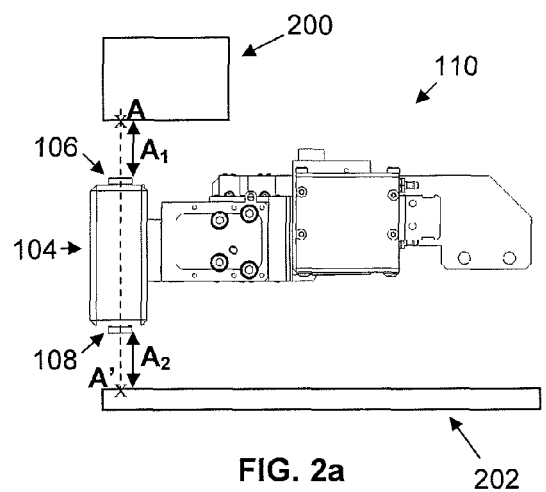
FIGS. 2a-2d show an operation of the embodiment of FIG. 1 to determine alignment of the bondhead of the die bonder relative to the workchuck.

FIG. 2a shows a side view of the bondhead alignment device 100 measuring the upper distance $A_1$ between the bonding surface of the bondhead 200 and the top capacitive sensor 106, and the lower distance $A_2$ between the bottom capacitive sensor 108 and the supporting surface of the workchuck 202, when the sensor mount 104 is aligned along the first vertical datum axis A-A' relative to the bondhead 200 and the workchuck 202. At this position, the top capacitive sensor 106 measures its distance $A_1$ from the bonding surface of the bondhead 200 at datum point A, while the bottom capacitive sensor 108 measures its distance $A_2$ from the supporting surface of the workchuck 202 at datum point A'. A processor of the bondhead alignment device 100 then calculates a sum $A_{total}$ of the measured distances of $A_1$ and $A_2$ corresponding to the vertical datum axis A-A'.

Figure 2B:
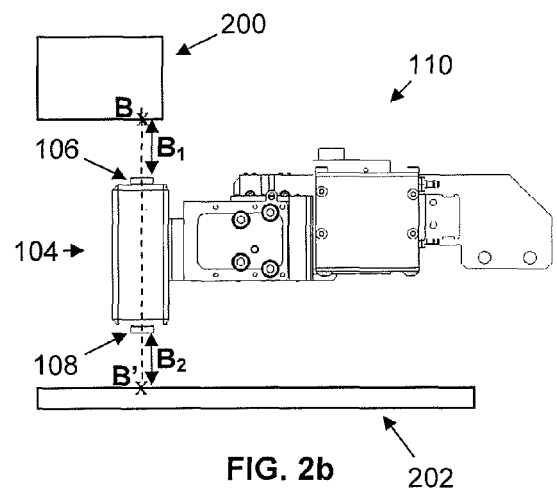

Thereafter, the motor in the motor mount assembly 110 actuates to move the sensor mount 104 linearly along the robotic arm 102a in the Y direction to position the capacitive sensors 106, 108 along a second vertical datum axis B-B' with respect to the bondhead 200 and the workchuck 202, as shown in FIG. 2b. At this position, the top capacitive sensor 106 measures its distance $B_1$ from the bonding surface of the bondhead 200 at datum point B, while the bottom capacitive sensor 108 measures its distance $B_2$ from the supporting surface of the workchuck 202 at datum point B'. The processor of the bondhead alignment device 100 again calculates a sum $B_{total}$ of the measured distances of $B_1$ and $B_2$ corresponding to the vertical datum axis B-B'.

Figure 2C:
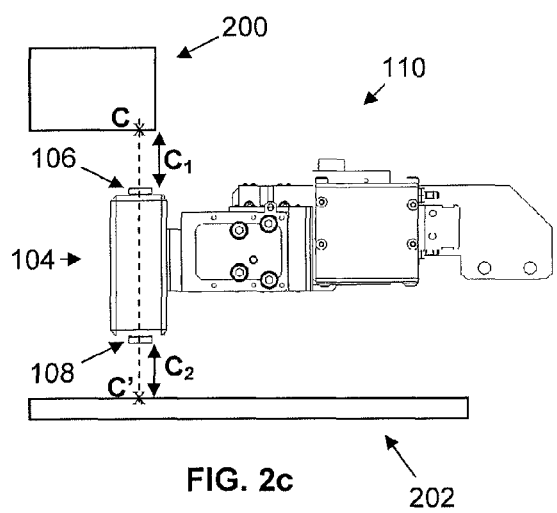

Subsequently, the robotic arm 102a is actuated to move relative to the other robotic arm 102b linearly along the X direction to position the capacitive sensors 106, 108 along a third vertical datum axis C-C' with respect to the bondhead 200 and the workchuck 202, as shown in FIG. 2c. At this position, the top capacitive sensor 106 again measures its distance $C_1$ from the bonding surface of the bondhead 200 at datum point C, while the bottom capacitive sensor 108 measures its distance $C_2$ from the supporting surface of the workchuck 202 at datum point C'. The processor of the bondhead alignment device 100 then calculates a sum $C_{total}$ of the measured distances of $C_1$ and $C_2$ corresponding to the vertical datum axis C-C'.

Figure 2D:
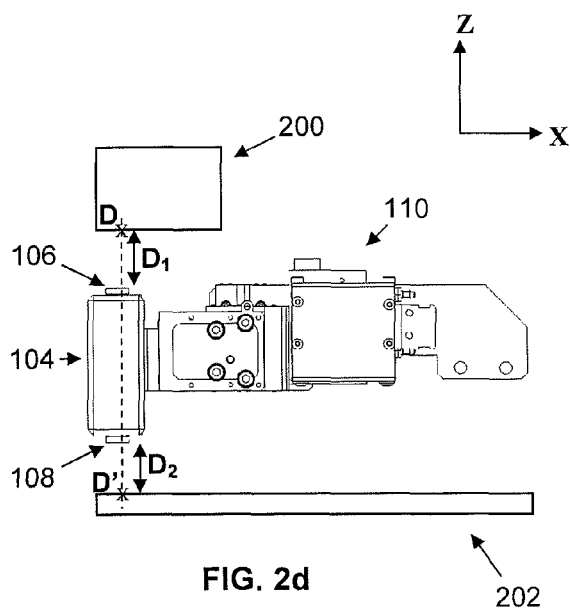

Finally, the motor in the motor mount assembly 110 again actuates to move the sensor mount 104 in an opposite linear motion along the robotic arm 102a in the Y direction to position the capacitive sensors 106, 108 along a fourth vertical datum axis D-D' with respect to the bondhead 200 and the workchuck 202, as shown in FIG. 2d. At this position, the top capacitive sensor 106 measures its distance $D_1$ from the bonding surface of the bondhead 200 at datum point D, while the bottom capacitive sensor 108 measures its distance $D_2$ from the supporting surface of the workchuck 202 at datum point D'. The processor of the bondhead alignment device 100 then calculates a sum $D_{total}$ of the measured distances of $D_1$ and $D_2$ corresponding to the vertical datum axis D-D'.

With the sums of the measured distances that correspond to the four vertical datum axes A-A', B-B', C-C' and D-D', the processor of the bondhead alignment device 100 can determine the alignment of the bondhead 200 relative to the workchuck 202 based on the differences of these sums of measured distances.

It should be noted that the datum points A-D preferably relate to points at or near the outer edges of the bondhead 200. This is because the bonding surface area of the bondhead 200 as defined by the four datum points A-D can be maximized, which advantageously improves the measurement accuracy of the bondhead alignment device 100. Nevertheless, it should be appreciated that the datum points A-D may also be positioned at other locations of the bonding surface of the bondhead 200, and not necessarily at or near the outer edges of the bondhead 200. Furthermore, although the bondhead alignment device 100 determines the bondhead alignment based on four datum axes, it should be appreciated that other numbers of datum axes (e.g. three or five) are also possible.

Moreover, it should be noted that the motor mount module 110 may thermally expand due to the high temperature environment during operation. As the sensor mount 104 is mounted to the motor mount module 110, thermal expansion of the motor mount module 110 may consequently shift the sensor mount 104 along the vertical Z axis. However, since the bondhead alignment device 100 is configured to measure the sum of the upper and lower distances between the capacitive sensors 106, 108 from the respective bondhead 200 and the workchuck 202, any shift of the sensor mount 104 along the vertical Z axis due to thermal expansion of the motor mount module 110 would not compromise the measurement accuracy of the bondhead alignment device 100. In fact, since the bondhead alignment device 100 is further configured to compare the sum of the upper and lower distances as measured by the capacitive sensors 106, 108 which are typically resilient to high temperatures, the effect of high temperature generally would not compromise the measurement accuracy of the bondhead alignment device 100.

Figure 3A:
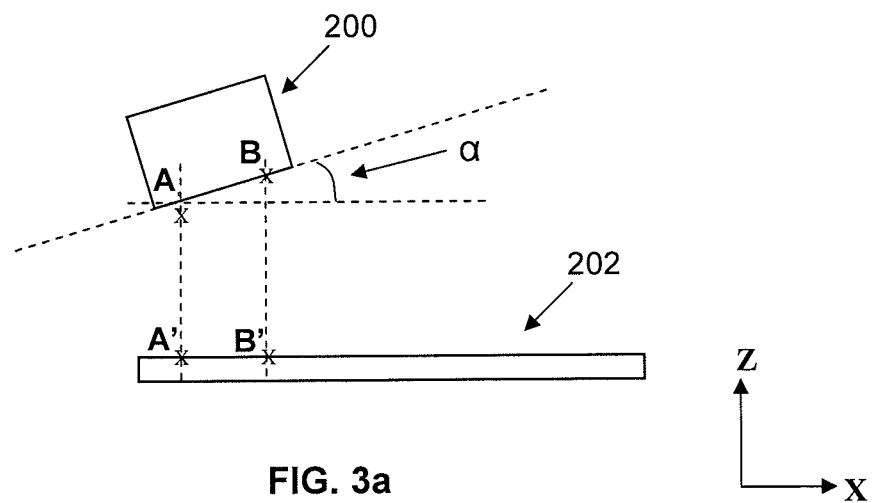
FIGS. 3a-3b show a method of measuring tilt angles of the bondhead relative to the workchuck using the embodiment of FIG. 1.
Figure 3B:
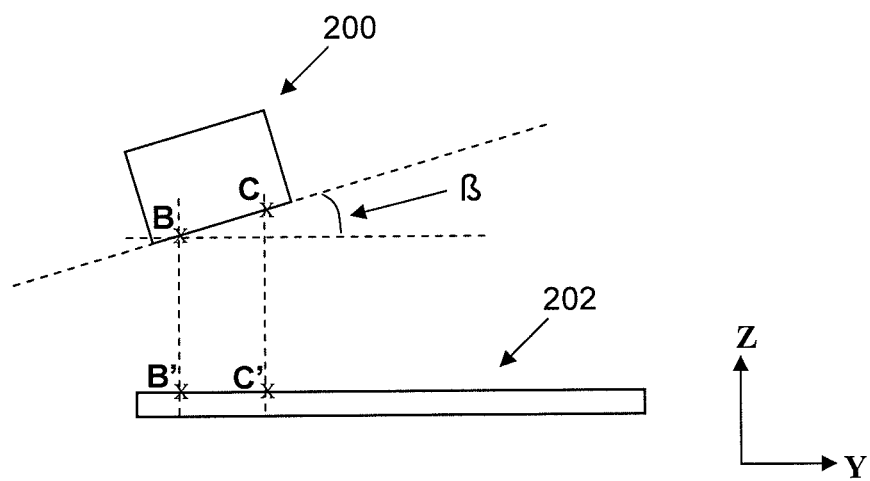

FIGS. 3a and 3b illustrate a method of determining the alignment of the bondhead 200 relative to the workchuck 202 by the bondhead alignment device 100, based on three datum axes A-A', B-B', and C-C'.

In particular, and as shown in FIG. 3a, the processor of the bondhead alignment device 100 relies on the difference of the previously-derived sums $A_{total}$ and $B_{total}$ of the measured distances between the capacitive sensors 106, 108 and the respective bondhead 200 and the workchuck 200, to determine a tilt angle α of the bondhead 200 relative to the workchuck 202 along the X axis. Since the datum points A and B at the bonding surface of the bondhead 200 are pre-determined, coordinates $(X_A, Y_A)$ of the datum point A and coordinates $(X_B, Y_B)$ of the datum point B on the XY plane are known. Thus, the tilt angle α of the bondhead 200 relative to the workchuck along the X axis can be derived by the processor from the equation, as follows:

$$\alpha = \tan^{-1}\left(\frac{B_{total} - A_{total}}{X_B - X_A}\right)$$

Likewise, and as shown in FIG. 3b, the processor of the bondhead alignment device 100 relies on the difference of the previously-derived sums $B_{total}$ and $C_{total}$ of the measured distances between the capacitive sensors 106, 108 and the respective bondhead 200 and the workchuck 200, to determine a tilt angle β of the bondhead 200 relative to the workchuck 202 along the Y axis. Since the datum point C at the bonding surface of the bondhead 200 is pre-determined, coordinates $(X_C, Y_C)$ of the datum point C on the XY plane are also known. Thus, the tilt angle β of the bondhead 200 relative to the workchuck along the Y axis can be derived by the processor from the equation, as follows:

$$\beta = \tan^{-1}\left(\frac{C_{total} - B_{total}}{Y_C - Y_B}\right)$$

Thus, by relying on the differences of the sums of distances along the datum axes as measured by the capacitive sensors 106, 108, the bondhead alignment device 100 is able to determine the alignment of the bondhead 200 relative to the workchuck 202, which is then fed back to the die bonder. The die bonder then accordingly adjusts the position of the bondhead 200, based on the bondhead alignment as measured by the bondhead alignment device 100.

It should be appreciated that tilt angles of the bondhead 200 relative to the workchuck 202 along the X and Y axes at opposite sides to those as shown in FIGS. 3a and 3b are also measured, based on the same principles described above and using the coordinates $(X_D, Y_D)$, the sum $D_{total}$ of the distances as measured by the capacitive sensors 106, 108.

It should also be appreciated that repeat measurements of the distances along the same vertical datum axes A-A', B-B', C-C', D-D' may be performed by the bondhead alignment device 100 by actuating the position actuator 114 along the vertical guides in the Z direction, so that different sets of the distance measurements as taken by the capacitive sensors 106, 108 can be averaged to minimize errors.

By ensuring all tilt angles of the bondhead 200 relative to the workchuck 202 along the X and Y axes are identical, the bonding surface of the bondhead 200 would accordingly be parallel and aligned with the supporting surface of the workchuck 202 before the die bonding process begins. This advantageously ensures the quality and reliability of the die bonding process.

Various embodiments of the bondhead alignment device 100 are also possible without departing form the scope of the present invention. For instance, it is not necessary to provide the top and bottom capacitive sensors 106, 108 between the bondhead 200 and the workchuck 202 to measure the respective distances between the capacitive sensors 106, 108 and the bondhead 200 and workchuck 202. Instead, a single capacitive sensor may be provided to measure its distance from a plurality of datum points on the bondhead 200 to determine the alignment of the bondhead 200 with respect to the workchuck 202. Moreover, other types of non-contact displacement sensors may also be used in place of the capacitive sensors 106, 108. Examples include inductive sensors and/or photoelectric sensors. Nonetheless, the capacitive sensors 106, 108 are preferred to such other types of non-contact displacement sensors as inductive sensors and photoelectric sensors due to the high temperature environment (e.g. more than 200° C.) in which these sensors may operate. This is because the coil binder in an inductive sensor may not withstand temperatures above 200° C. and thus, the inductive sensor may fail at high temperatures due to short circuit. Also, the presence of a mirage effect at high temperatures means that the measurement accuracy of the photoelectric sensor may be affected by the varying air density in a light path. In the case of capacitive sensors, the applied electrical field is not affected by high temperatures. Thus, capacitive sensors are preferably used in the bondhead alignment device 100. Moreover, the embodiment of the bondhead alignment device 100 comprising the sensor mount 104 made up of a low thermal expansion material (e.g. Zerodur®) and the capacitive sensors 106, 108 mounted to the top and bottom of the sensor mount 104 advantageously provides a bondhead alignment method that is temperature-independent, since such an embodiment is able to maintain its length within a range of a few nanometers (e.g. between 10-100 nanometers) at high temperatures (e.g. more than 200° C.).

The invention claimed is:

1. A bonding apparatus for performing bonding operations on semiconductor dies, the bonding apparatus comprising:
   a workchuck configured to support a semiconductor die carrier to which the semiconductor dies are bonded;
   a bondhead configured to perform the bonding operations on the semiconductor dies; and
   an alignment-determining apparatus configured to determine an alignment of the bondhead relative to the workchuck, the alignment-determining apparatus comprising:
      a sensor mount having opposite top and bottom ends;
      a first sensor mounted to the top end of the sensor mount and a second sensor mounted to the bottom end of the sensor mount, the first and second sensors being configured to measure distances;
      a positioning device coupled to the first and second sensors, the positioning device being configured to move the first sensor relative to a first plurality of locations on the bondhead facing the first sensor, and to move the second sensor relative to a second plurality of locations on the workchuck facing the second sensor,
      wherein the first sensor is operative to measure a first set of distances between each of the first plurality of locations on the bondhead and the first sensor, and the second sensor is operative to measure a second set of distances between each of the second plurality of locations on the workchuck and the second sensor, the first and second sets of distances being for determining the alignment of the bondhead relative to the workchuck.

2. The bonding apparatus of claim 1, further comprising a processor configured to add each of the distances from the first set of distances with a corresponding distance from the second set of distances to generate a plurality of added distances, and to compare the plurality of added distances for determining the alignment of the bondhead.

3. The bonding apparatus of claim 1, wherein at least one of the plurality of locations on the bondhead to which the sensor of the alignment-determining apparatus is configured to be moved is at an outer edge of the bondhead.

4. The bonding apparatus of claim 1, wherein each sensor of the alignment-determining apparatus is a non-contact sensor.

5. The bonding apparatus of claim 4, wherein each sensor of the alignment-determining apparatus is a capacitive sensor.

6. The bonding apparatus of claim 1, wherein the alignment-determining apparatus further comprises a sensor mount for coupling each sensor to the positioning device.

7. The bonding apparatus of claim 6, wherein the sensor mount of the alignment-determining apparatus further comprises a thermal control device for controlling a temperature of each sensor.

8. The bonding apparatus of claim 7, wherein the thermal control device of the alignment-determining apparatus comprises an interior channel for allowing a cooling fluid to cool the sensor mount.

9. The bonding apparatus of claim 6, wherein the sensor mount of the alignment-determining apparatus is made of a low thermal expansion material.

10. The bonding apparatus of claim 9, wherein the low thermal expansion material comprises: i) FeNi36; ii) Ni—Fe alloy; or iii) a Lithium Aluminosilicate glass-ceramic.

* * * * *